United States Patent
Sugai et al.

(10) Patent No.: US 6,339,297 B1
(45) Date of Patent: Jan. 15, 2002

(54) PLASMA DENSITY INFORMATION MEASURING METHOD, PROBE USED FOR MEASURING PLASMA DENSITY INFORMATION, AND PLASMA DENSITY INFORMATION MEASURING APPARATUS

(75) Inventors: Hideo Sugai, Kasugai; Seiichi Takasuga; Naoki Toyoda, both of Takarazuka, all of (JP)

(73) Assignees: Nissin Inc., Hyogo-ken; President of Nagoya University, Aiti-ken, both of (JP)

( * ) Notice: Subject to any disclaimer, the term of this patent is extended or adjusted under 35 U.S.C. 154(b) by 0 days.

(21) Appl. No.: 09/357,773

(22) Filed: Jul. 21, 1999

(30) Foreign Application Priority Data

Jul. 23, 1998 (JP) .......................... 10-208129
Mar. 5, 1999 (JP) .......................... 11-058636

(51) Int. Cl.[7] .................................. H01J 7/24
(52) U.S. Cl. .................. 315/111.21; 315/111.51; 315/111.41; 156/345; 324/756
(58) Field of Search .................. 315/111.21, 111.51, 315/111.41; 324/576; 156/345

(56) References Cited

U.S. PATENT DOCUMENTS

| | | | | |
|---|---|---|---|---|
| 5,111,111 A | * | 5/1992 | Stevens et al. | 315/111.41 |
| 5,471,115 A | | 11/1995 | Hikosaka | 315/111.21 |
| 5,841,237 A | * | 11/1998 | Alton | 315/111.81 |
| 5,900,103 A | * | 5/1999 | Tomoyasu et al. | 156/345 |
| 5,997,687 A | * | 12/1999 | Koshimizu | 315/111.21 |
| 6,199,505 B1 | * | 3/2001 | Sato et al. | 156/345 |

FOREIGN PATENT DOCUMENTS

| | | | |
|---|---|---|---|
| DE | 0 719 077 A1 | 6/1996 | |
| JP | 0 975 005 A2 | 1/2000 | H01J/37/32 |

* cited by examiner

Primary Examiner—Don Wong
Assistant Examiner—Jimmy T. Vu
(74) Attorney, Agent, or Firm—Arent Fox Kintner Plotkin & Kahn, PLLC

(57) ABSTRACT

A plasma density information measuring method capable of easily measuring the plasma density information over the long term, a probe for measuring the plasma density information, and a plasma density information measuring apparatus are disclosed. A measuring probe is set such that a tip end of a glass tube of the measuring probe is brought into contact with plasma PM to be measured. High-frequency power sent through a coaxial cable is supplied to the plasma PM from a loop antenna through a wall of the tube, and reflection power of the high-frequency power is received by the loop antenna to obtain a counter frequency variation of reflection coefficient of the high-frequency power. In the obtained reflection coefficient, a portion thereof in which the reflection coefficient is largely reduced is a peak at which strong absorption of high-frequency power is caused due to the plasma density. The plasma density can be obtained from the plasma absorption frequency.

7 Claims, 14 Drawing Sheets

US 6,339,297 B1

PLASMA DENSITY INFORMATION MEASURING METHOD, PROBE USED FOR MEASURING PLASMA DENSITY INFORMATION, AND PLASMA DENSITY INFORMATION MEASURING APPARATUS

BACKGROUND OF THE INVENTION (1) Field of the Invention

The present invention relates to: a plasma density information measuring method in plasma used in a producing process of a thin film component, a particle beam source or an analysis apparatus; a probe for measuring the plasma density information used for measuring the plasma density information; and a plasma density information measuring apparatus; and more particularly, to a technique for easily measuring the plasma density information over the long term.

(2) Description of the Related Art

In recent years, the use of plasma is increased. In a producing process of a thin film component, using high-frequency plasma generated by high-frequency power (high-frequency electric power) in a range from a RF frequency band of about 10 MHz to a micro frequency band of 2.45 GHz, etching process or CVD (chemical-vapor deposition) are conducted. In such a plasma application technique, it is extremely important for conducting appropriate process to sufficiently grasp the information concerning plasma density which excellently shows the characteristics of generated plasma. In the case of typical plasma comprising monovalent positive ion and electron, the positive ion density and the electron density are substantially equal to each other due to the properties particular to plasma that electrically neutral state is maintained, the electron density is generally called as plasma density.

Conventionally, as a method for measuring the electron density in plasma, there is an electron beam irradiation type plasma vibration probe which was developed relatively recently, in addition to a Langmuir/probe method and a microwave interference measuring method.

The Langmuir/probe method is a method in which a metal probe is directly exposed in plasma in this state, direct current bias voltage, or direct current bias voltage on which high-frequency voltage is superposed is applied to the metal probe, and based on the current value flowing through at that time, electron density is measured.

The microwave interference measuring method is a method in which a chamber for generating plasma is provided with windows which are opposed to each other with plasma positioned therebetween, microwave (e.g., single color laser light) is radiated to the plasma through one of the windows, and the microwave ejected from the other window is detected, and electron density is obtained based on phase contrast between the radiated microwave and ejected microwave.

The electron beam irradiation type plasma vibration method is a method in which a hot filament is placed in a chamber, and based on frequency of plasma oscillations generated when electron beam is irradiated to the plasma from the hot filament, electron density is obtained.

However, when the Langmuir/probe method is used for reactive plasma, there is a problem that the measuring can not be continued for a long time (i.e., life time is short). This is because that stains comprising insulative films are adhered on a measured metal probe within a short time, the current value flowing through the metal probe is varied, and accurate measurement can not be continued soon. In order to remove the stains adhered on the metal probe surface, a method in which negative bias voltage is applied to the metal probe to carry out sputter-removing method using ion, and a method in which the metal probe is allow to glow to evaporate and remove the stains have been attempted, but the effect is poor, and the problem is not solved by these methods.

Further, the microwave interference measuring method has a problem that the measurement can not be conducted easily. This is because a large-scale and expensive apparatus and adjustment of microwave transmission path are necessary, the phase contrast between the radiated microwave and ejected microwave is small and thus, it is difficult to measure precisely. Further, in the case of the microwave interference measuring method, there are drawbacks that only the average density can be obtained, there is no spatial resolution.

Furthermore, in the case of the electron beam irradiation type plasma vibration probe method, in addition to anxiety of plasma atmosphere contamination due to tungsten which is evaporated from the hot filament, there is a problem of anxiety of interruption of measurement caused by break of hot filament. Especially in the case of plasma using oxygen or chlorofluorocarbons gas, the hot filament is easily cut or broken, and it is necessary to frequently exchange the filament, it can not be said that this is practical.

SUMMARY OF THE INVENTION

In view of the above circumstances, it is an object of the present invention to provide a plasma density information measuring method capable of easily measuring the plasma density information over the long term, a probe for measuring the plasma density information, and a plasma density information measuring apparatus.

To achieve the above object, the present invention provides the following structure.

That is, a plasma density information measuring method of the present invention comprises the steps of:

supplying high-frequency power to plasma;

measuring a physical amount indicative of reflection or absorption state of the high-frequency power by plasma load; and obtaining a frequency at which strong high-frequency power absorption is caused due to plasma density, i.e., a plasma absorption frequency based on the measurement result of the physical amount.

In the case of the plasma density information measuring method of the present invention, the high-frequency power is supplied to plasma, the physical amount indicative of reflection or absorption state of the high-frequency power by plasma load is measured (for example, the reflection amount of the high-frequency power or impedance value of the plasma load is measured). Based on the measured result of the physical amount, plasma absorption frequency at which high-frequency power resonant strong absorption is generated due to plasma density is obtained. If the high-frequency power resonant strong absorption is caused, since the physical amount indicative of reflection or absorption state of high-frequency power by plasma load is largely varied, plasma absorption frequency can easily be obtained. Since the obtained plasma absorption frequency has constant correlation with the plasma density, this is useful plasma density information. In the present invention, high-frequency power, i.e., high-frequency electromagnetic wave is supplied to plasma and thus, even if stains comprising insulative films are adhered to the antenna which supplies high-frequency power, there is little influence, and the plasma absorption frequency can be measured accurately.

In this point, the present invention is superior to the conventional Langmuir probe method. Because in this method, electric current flowing when ion in plasma reaches a surface of a metal probe is detected and therefore, if insulative film is adhered to the metal probe, it is impossible to measure. Further, according to the present invention, since a hot filament is not used unlike the electron beam irradiation type plasma vibration probe method, there is no anxiety of breaking of filament, and it is possible to obtain the plasma density information over the long term.

In the method of the invention, it is preferable that the high-frequency power is supplied to plasma through a division wall. By interposing the dielectric division wall between the plasma side to be measured and the supplying side of the high-frequency power, a foreign object should not enter the plasma from the supplying side of the high-frequency power, and plasma can be maintained clean. Further, in the case of reactive plasma also, the high-frequency power supplying side is not damaged. Furthermore, even if stains such as insulative films are adhered to the surface of the dielectric division wall, there is no change in the measuring system, it is possible to obtain the plasma density information for longer time.

In the present invention, for example, the physical amount indicative of reflection or absorption state of the high-frequency power by plasma load is measured by measuring an electric current amount of a high-frequency amplifier for supplying high-frequency power. Through the high-frequency amplifier for supplying high-frequency power, electric current corresponding to a degree of reflection or absorption of the high-frequency power by the plasma load flows. Therefore, it is possible to easily measure the physical amount indicative of reflection or absorption state of the high-frequency power by measuring this electric current.

In the present invention, for example, the reflection amount of high-frequency power is detected while sweeping high-frequency power frequency, and the plasma absorption frequency is obtained based on relationship between sweep-frequency and a detected result of the reflection amount of high-frequency power. That is, it is possible to easily obtain a frequency at which the reflection amount of the high-frequency power is largely reduced, as a frequency at which the high-frequency power resonant strong absorption is caused due to the plasma density, i.e., as a plasma absorption frequency.

In the present invention, a plasma surface wave resonance frequency is obtained as the plasma absorption frequency for example. The surface wave resonance frequency f is correctly corresponds to the electron density ne in plasma.

In the present invention, electron density in plasma to be measured is calculated in accordance with the obtained plasma surface wave resonance frequency. That is, the electron density $n_e$ in plasma is calculated in accordance with the surface wave resonance frequency $f=\omega/2\pi$ (wherein $\omega$ is surface wave resonance frequency). The electron density $n_e$ is substantially equivalent to the plasma density. The electron density $n_e$ can easily be calculated in accordance with the following equation (1):

$$n_e = \epsilon_o \cdot M_e \cdot \omega_p/e^2 \quad (1)$$

wherein $\omega_p$: electron plasma angle frequency $$[\omega_p = \omega \times \sqrt{(1+\epsilon)}]$$

$\epsilon$: dielectric constant of dielectric division wall, $\epsilon_o$: vacuum dielectric constant $m_e$: electron mass, e: electron amount In the present invention, for example, Tonks-Dattner resonance frequency is obtained as the plasma absorption frequency. If the high-frequency power is radiated to the plasma, a plurality of absorption spectrum is observed in addition to the surface wave resonance. It is considered that this corresponds to so-called Tonks-Dattner resonance. That is, when electromagnetic wave is radiated from outside of cylindrical plasma and power absorbed by the plasma is measured, strong absorption is caused at plurality of frequencies around the electron plasma angle frequency $\omega_p$. This phenomenon is cased as Tonks-Dattner resonance from the name of the detector. According to subsequent research, it is explained that the mechanism causing this resonance is that electron plasma wave transmitted in radial direction is excited by electromagnetic wave, and resonant absorption is caused when the excited electron plasma wave is reflected at the plasma end and standing wave is generated. Further, since there is relationship between the resonance frequency and the electron plasma angle frequency $\omega_p$, if the plasma density is varied, the Tonks-Dattner resonance frequency is also varied. That is, the Tonks-Dattner resonance frequency provides plasma density information.

The present invention provides a probe used for measuring plasma density information, comprising:

a dielectric tube whose tip end is closed;

an antenna accommodated in the tube at its tip end side for radiating high-frequency power; and a cable accommodated in the tube at its rear side and connected to the antenna for transmitting the high-frequency power.

When the plasma density information is measured using the probe used for measuring plasma density information of the invention, the probe is set such that the tip end of the tube is brought into contact with the plasma to be measured, the high-frequency power sent through the cable is supplied to the plasma from the antenna through the dielectric tube wall, and the reflection power of the high-frequency power required for measuring the plasma absorption frequency is received by the antenna, and taken out through the cable. Since the range where the high-frequency power from the antenna influences the plasma is not so wide, it is also possible to obtain a local plasma density information if the amount of the high-frequency power is adjusted. That is, if the plasma density information measuring probe of the invention is used, it is possible to easily prepare necessary state for measuring the plasma density information, and to obtain spatial resolution. Further, since the antenna is covered with the dielectric tube, plasma is not contaminated, and the antenna is not damaged by the plasma and thus, the lifetime is long.

In the probe used for measuring plasma density information of the invention, it is preferable that the antenna and the cable accommodated in the dielectric tube are capable of moving along a longitudinal direction of the tube such that a position of the antenna in the tube can be varied. In this example, the position of the antenna in the dielectric tube is changed along the longitudinal direction of the tube several times. And plasma absorption frequencies at the antenna positions are measured. Among the several absorption frequencies obtained by this measurement, the lowest frequency that is not varied even if the position of the antenna is changed is obtained as a surface wave resonance frequency.

In the probe used for measuring plasma density information of the invention, it is preferable that a conductor for preventing a leakage of ejected electromagnetic wave from the antenna is disposed at a position slightly back from the antenna such as to occlude a gap between the cable and an inner surface of the tube. With this structure, since the conductor disposed slightly back from the antenna prevents the electromagnetic wave power discharged from the antenna from leaking outside except plasma, measuring error due to the leakage of the high-frequency power is avoided.

In the probe used for measuring plasma density information of the invention, it is preferable that probe cooling means for forcibly cooling the probe is disposed. According to this example, since the probe is forcibly cooled by the probe cooling means, the measuring error by temperature rise of the tube or cable is avoided.

In the probe used for measuring plasma density information of the invention, it is preferable that the cable for transmitting high-frequency power comprises a conductor tube for a core wire and a shield, and an insulative ceramics material for filling a gap between the core wire and the conductor tube. According to this example, since the gap between the core wire and the conductor tube. According to this example is filled with the heat-resistant insulative ceramics material, the heat-resistance of the cable is enhanced.

In the probe used for measuring plasma density information of the invention, it is preferable that a surface of the dielectric tube is coated with metal such that a measuring area of the dielectric tube is not coated. According to this example, since the surface of the dielectric tube is coated with metal such that the measuring area of the dielectric tube is not coated, the local state of the measuring area that is not coated with metal is strongly reflected to the measured result, and the spatial resolution is enhanced.

In the probe used for measuring plasma density information of the invention, it is preferable that the antenna is extended closely along an inner surface of the dielectric tube. With this structure, since the high-frequency power irradiated from the antenna is effectively supplied to the plasma, the supply amount of the high-frequency power may be small, and the measuring precision is enhanced.

A plasma density information measuring apparatus of the present invention comprises:

sweep-frequency type high-frequency power supplying means for supplying high-frequency power to plasma while sweeping frequency;

reflection power amount detecting means for detecting a reflection amount of the high-frequency power; and power reflection coefficient frequency characteristics obtaining means for obtaining a counter frequency variation of reflection coefficient of high-frequency power based on a sweep-frequency of the high-frequency power and the detected result of the reflection amount of high-frequency power.

According to the apparatus of the invention, it is possible to easily measure the plasma absorption frequency as the plasma density information.

In the apparatus of the invention, it is preferable that the apparatus further includes a dielectric division wall interposed between plasma and the sweep-frequency type high-frequency power supplying means. According to this structure, since the dielectric division wall interposed between plasma and the sweep-frequency type high-frequency power supplying means is provided, it is possible to maintain the plasma clean.

In the apparatus of the invention, it is preferable that the apparatus includes the above-described plasma density information measuring probe, and high-frequency power is supplied from the antenna in the tube to plasma using a tube wall of the dielectric tube as a division wall, a plurality of antennas are accommodated in the dielectric tube such that distances between a tip end of the tube and the antennas are different from one another, and the power reflection coefficient frequency characteristics obtaining means obtains a counter frequency variation of reflection coefficient of high-frequency power for each of the antennas, and a plasma absorption frequency appearing at the same frequency in the counter frequency variations is obtained as a plasma surface wave resonance frequency. With this structure, it is possible to easily measure the plasma density information, and to generate the spatial resolution. In addition, it is possible to easily obtain the plasma surface wave resonance frequency from the counter frequency variation of reflection coefficient of the high-frequency power from the antennas having different distances from the tip and of the tube.

In the apparatus of the invention, it is preferable that a plasma density information measuring probe is inserted in a chamber which generates plasma for forward and backward movement, and the probe is moved such that a tip end of the probe is pulled backward from a measuring position in the chamber to a retreat position in the vicinity of a wall surface of the chamber when measurement is not carried out. With this structure, since the probe is moved such that a tip end of the probe is pulled backward from a measuring position in the chamber to a retreat position in the vicinity of a wall surface of the chamber when measurement is not carried out, even if the plasma allows stains to adhered to the surface of the probe, it is possible to move the probe toward the plasma only when the measurement is carried out, to prevent the probe from being contaminated, and to keep using the probe for a long time.

In the apparatus of the invention, it is preferable that protecting means for blocking excessive plasma generating high-frequency power which enters the antenna in the probe is provided behind the plasma density information measuring probe. With this structure, when excessive plasma generating high-frequency power enters the antenna in the probe, the protecting means provided behind prevent the excessive high-frequency power, thereby preventing the apparatus from being destroyed. Especially when the generated plasma disappears unexpectedly, there is an adverse possibility that the high-frequency power for generating the plasma is directly placed on the antenna, and the probe control section is destroyed. However, this adverse possibility is overcome by the protecting means.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be explained in detail below with reference to the drawings.

Figure 1:
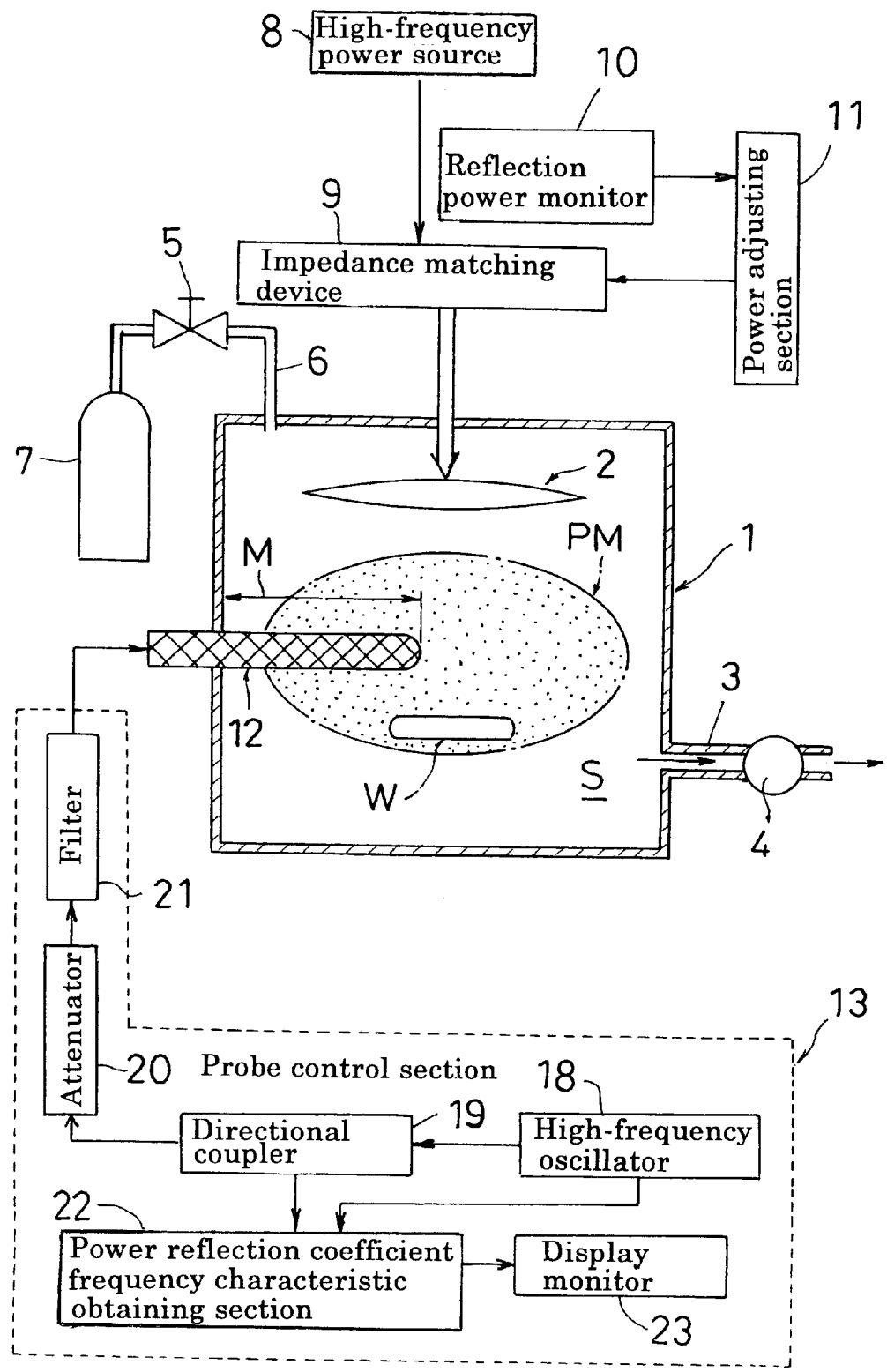
FIG. 1 is a block diagram showing a plasma processing system according to an embodiment of the present invention.
Figure 2:
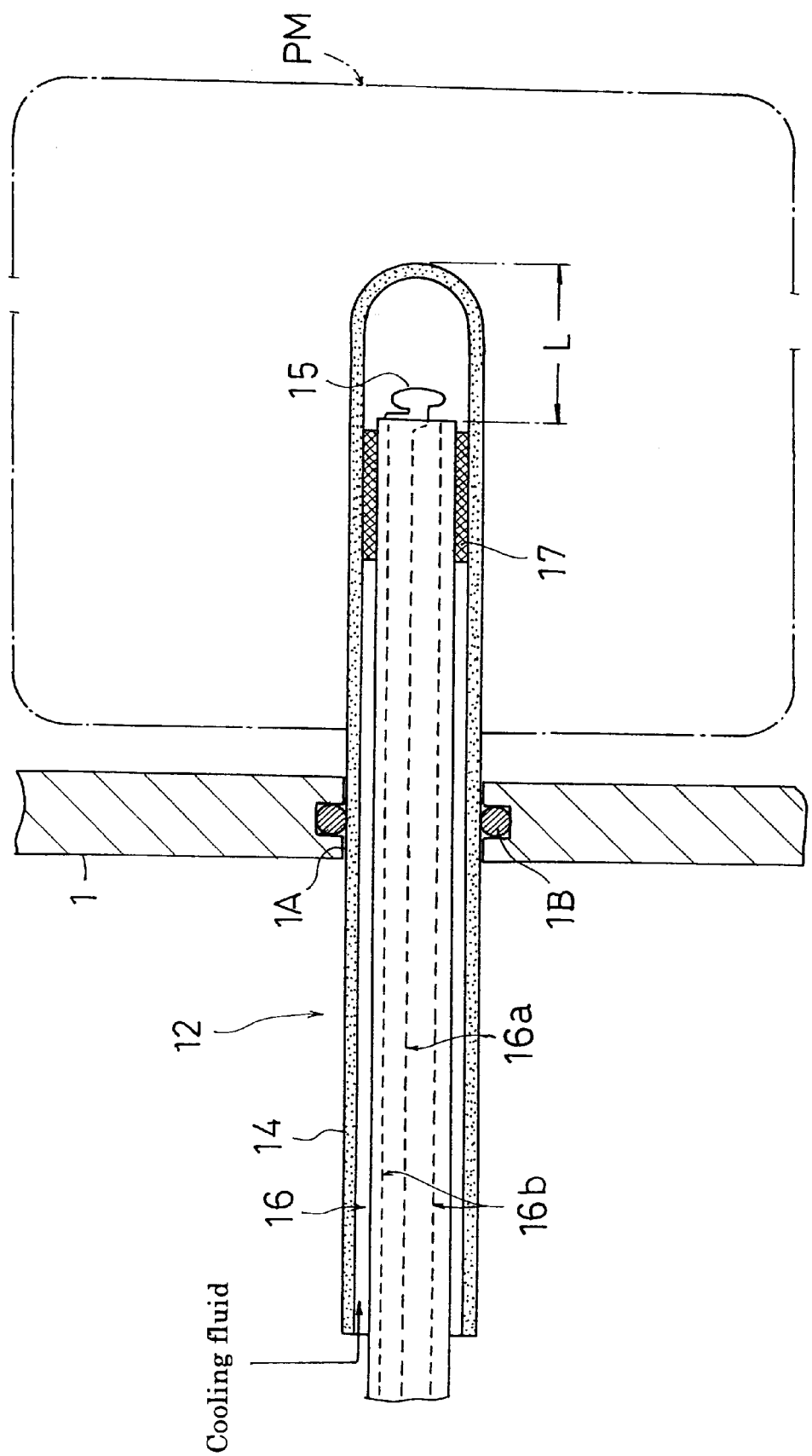
FIG. 2 is a vertical sectional view showing a measuring probe used in the system of the embodiment.
Figure 3:
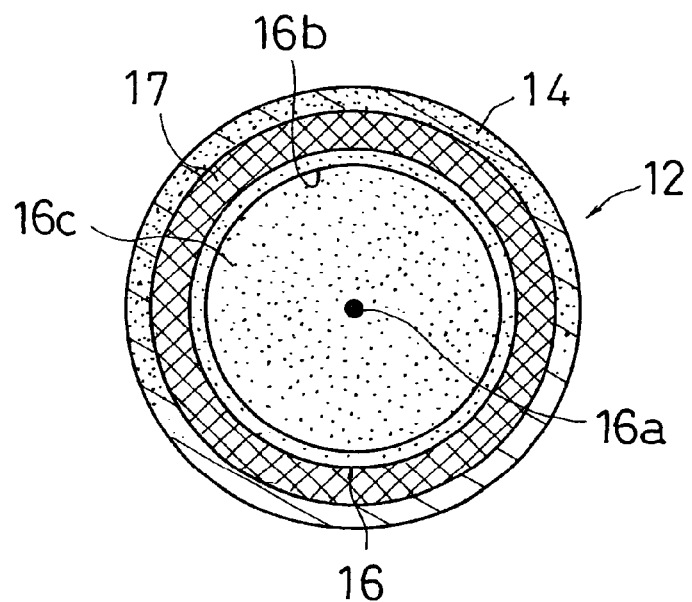
FIG. 3 is a transverse sectional view showing the measuring probe used in the system of the embodiment.

FIG. 1 is a block diagram showing a plasma processing system capable of carrying out one example of a plasma density information measuring method of the invention comprising one example of a plasma density information measuring probe and one example of a measuring apparatus of the invention. FIG. 2 is a vertical sectional view showing one example of structure of the plasma density information measuring probe (which will be omitted as "measuring probe" hereinafter) according to the invention. FIG. 3 is a transverse sectional view showing a structure of one example of the measuring probe of the invention.

As shown in FIG. 1, the plasma processing system of the embodiment comprises a cylindrical stainless steel chamber 1 of about 10 cm diameter having a space S in which reactive plasma (which will be omitted as "plasma" hereinafter) PM is generated, an ignition electrode (ignition antenna) 2 disposed in the chamber 1 for generating plasma, a vacuum discharge pump 4 which is in communication with the space S of the chamber 1 through a discharge pipe 3, and a gas source 7 which is in communication with the space S of the chamber 1 through a gas supply pipe 6 provided therein with a flow rate adjusting valve 5. In addition, a board (not shown) of a work (object to be processed) W, and a transfer-in/transfer-out mechanism of the work W are also disposed in the chamber 1 of the system of the present embodiment.

Air in the space S of the chamber 1 is exhausted by the vacuum discharge pump 4 and the space S is kept at appropriate pressure. Atmospheric pressure in the space S when plasma PM is generated is in a range from some mTorr to some tens mTorr for example. Gas is supplied from the gas source 7 at appropriate flow rate. Examples of the gas to be supplied are argon, nitrogen, oxygen gas, fluorine gas, and chlorine gas. The gas flow rate set by the flow rate adjusting valve 5 is in a range from 10 to 100 cc/minute for example.

A high-frequency electric source 8 for supplying high-frequency power (high-frequency electric power) for generating plasma is provided outside the chamber 1. The high-frequency power output from the high-frequency electric source 8 is sent to the ignition electrode 2 through an impedance matching device 9. The magnitude of the high-frequency power output from the high-frequency electric source 8 is in a range from about 1 to about 3 kW for example. The frequency of the high-frequency power should not be limited to particular frequency, but the frequency of the high-frequency power is usually in a range from RF band which is typically 13.56 MHz to a microwave band of about 900 MHz to 2.45 GHz.

In the case of plasma of inductively coupled RF discharge plasma, an induction coil is used as the ignition electrode 2, and in the case of capacitive coupled RF discharge plasma, a flat electrode is used as the ignition electrode 2. Further, in the case of microwave discharge plasma in which frequency of high-frequency power is frequency of microwave band, a horn antenna, a slot antenna or an opened waveguide is used as the ignition electrode 2.

When frequency of high-frequency power is RF band frequency, a matching circuit in which inductance and capacitance are combined is used as the impedance matching device 9. When frequency of high-frequency power is microwave band frequency, an EH tuner or a stub tuner is used as the impedance matching device 9.

In the case of the system of the present embodiment, there is provided a reflection power monitor 10 which detects a reflection amount of high-frequency power returning to the electric source side without being absorbed by plasma load, and which sends the detected reflection amount of the high-frequency power to the power adjusting section 11. The power adjusting section 11 controls the impedance matching device 9 such that the reflection amount (reflection electric power amount) of high-frequency power becomes minimum, and stabilizes the plasma density.

The work W is subjected to etching process or the CVD (chemical-vapor deposition) by plasma PM generated in this manner. The system of the embodiment is provided with an apparatus for measuring information concerning the plasma density which excellently shows the characteristics of the plasma PM. In order to subject the work W to appropriate processing, it is very important to measure the plasma density information to grasp the characteristics of the plasma PM.

As shown in FIG. 1, the plasma density information measuring apparatus of the embodiment comprises a measuring probe 12 mounted to a wall of the chamber 1, and a probe control section 13 disposed outside the chamber 1. A specific structure of the measuring probe 12 will be explained first.

As shown in FIGS. 2 and 3, the measuring probe 12 comprises a dielectric tube 14 whose tip end is closed and rear end is opened into atmosphere (outside air), a loop antenna 15 for radiating high-frequency power, a coaxial cable 16 connected to the loop antenna 15 for transmitting the high-frequency power to the loop antenna 15, and an aluminum conductor piece 17 for preventing leakage of radiated electromagnetic wave. The dielectric material forming the tube 14 is not particularly limited, but appropriate examples thereof are reinforced heat-resistant glass, quartz, and ceramic.

The loop antenna 15 and the coaxial cable 16 are accommodated in the tube 14 such that the loop antenna 15 comes first. The conductor piece 17 is disposed at a position slightly rearward of the loop antenna 15 such that a gap between the coaxial cable 16 and an inner surface of the tube 14. As a result, measuring error due to leakage of high-frequency power is avoided.

The measuring probe 12 is inserted and mounted from a through hole 1A provided in the wall of the chamber 1 such that a tip end of the measuring probe 12 is located in the chamber 1. An O-ring 1B is interposed between an outer peripheral surface of the measuring probe 12 and the through hole 1A of the chamber 1 so that vacuum leakage is not caused by placement of the measuring probe 12.

As shown in FIG. 3, the coaxial cable 16 is of a general coaxial structure in which fluoroplastic 16c is interposed between a core wire 16a and a shield wire 16b continuously surrounding the core wire 16a from its outside along the longitudinal direction. Cooling fluid such as air or nitrogen gas is forcibly sent into a gap between the tube 14 and the coaxial cable 16. As a result, measuring error which may be caused due to temperature rise of the tube 14 or the coaxial cable 16 is available. As sending means of the cooling fluid, the following structure can be employed. For example, a thin tube (not shown) is inserted into the gap between the tube 14 and the coaxial cable 16, and a tip end of the thin tube is positioned near the conductor piece 17. The cooling fluid is sent to a deep portion of the tube 14 through the thin tube to cool the measuring probe 12. The cooling fluid is not limited to gas such as air, and may be liquid such as water.

Figure 5:
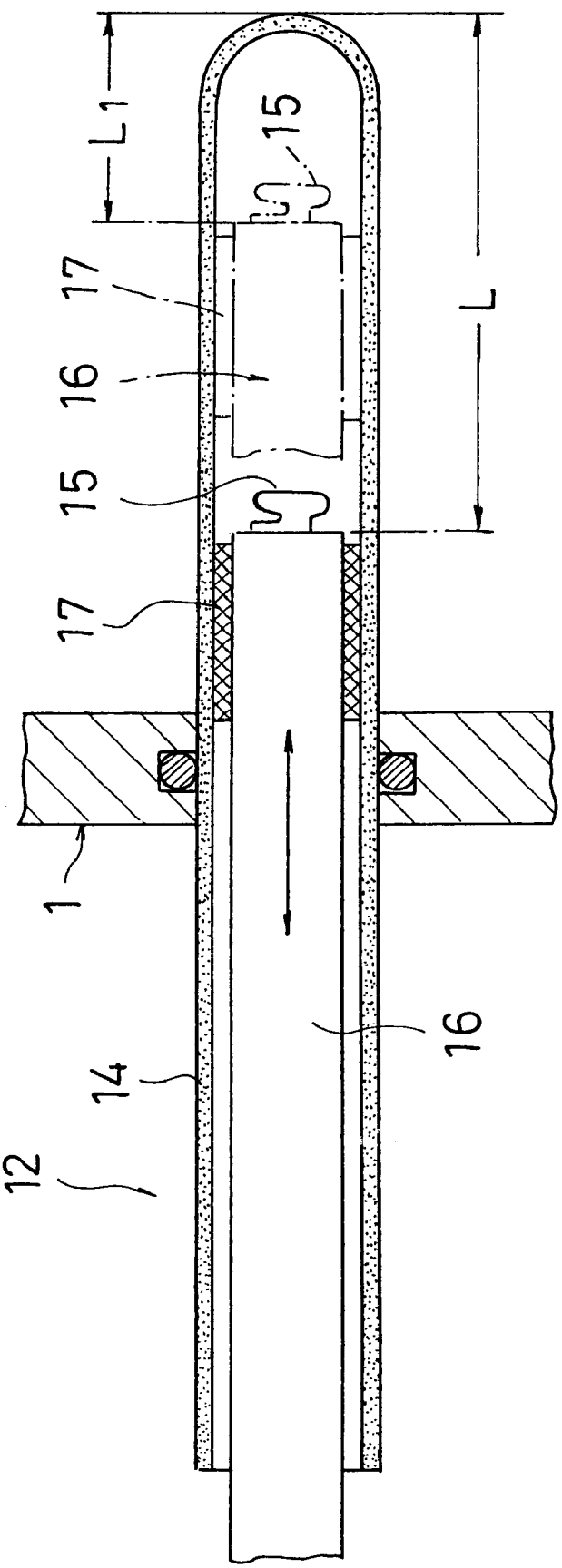
FIG. 5 is a sectional view showing a position changing state of a loop antenna in a measuring probe.

Further, as shown in FIG. 5, the loop antenna 15, the coaxial cable 16 and the conductor piece 17 are moved forward and backward as one unit by pulling or pushing the coaxial cable 16 in the longitudinal direction of the tube 14, so that the position of the loop antenna 15 is varied along the longitudinal direction of the tube 14. That is, with this measuring probe 12, the length L between the tip end of the tube 14 and a tip end of the conductor piece 17 including the loop antenna 15 can easily be varied.

Next, a specific structure of the probe control section 13 will be explained. The probe control section 13 comprises a swept-frequency high-frequency oscillator 18, a directional coupler 19, an attenuator 20, and a filter 21. These elements are connected to the measuring probe 12 in the order shown in FIG. 1. The high-frequency oscillator 18 outputs high-frequency power for measuring plasma density information of about 10 mW at frequency of 100 kHz to 3 GHz while automatically conducting swept-frequency. The high-frequency power output from the high-frequency oscillator 18 is transmitted to the measuring probe 12 through the directional coupler 19, the attenuator 20, and the filter 21 in this order.

On the other hand, the high-frequency power for measuring the plasma density information is not always emitted from the loop antenna 15 and absorbed by the plasma load, and some of the high-frequency power is not absorbed by the plasma load and reflected and returned. The reflection amount of the high-frequency power which is not absorbed by the plasma load and returned is detected by the directional coupler 19, and sent to a power reflection coefficient frequency characteristic obtaining section 22. High-frequency power frequency which is output from the high-frequency oscillator 18 is also sent to the power reflection coefficient frequency characteristic obtaining section 22.

The filter 21 removes high-frequency power for exciting plasma which is mixed into the probe control section 13 through the antenna 15. The attenuator 20 adjusts the amount of high-frequency power to be sent to the measuring probe 12.

Figure 4:
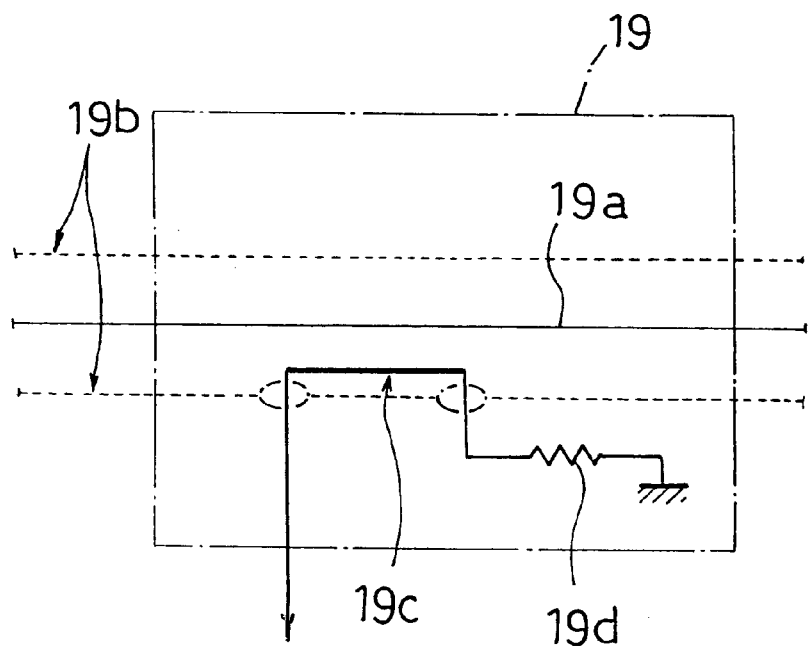
FIG. 4 is an equivalent circuit diagram of a directional coupler used in a plasma density information measuring apparatus.

As shown in FIG. 4, the directional coupler 19 is of a coaxial structure comprising a core wire 19a and a shield wire 19b continuously surrounding the core wire 19a from its outside along the longitudinal direction. A short coupling line 19c is provided along the core wire 19a inside of the shield wire 19b. A side of the coupling line 19c closer to the high-frequency oscillator is grounded through a resistor 19d so that the high-frequency power reflection amount can be detected at the non-grounded side of the coupling line 19c.

The power reflection coefficient frequency characteristic obtaining section 22 obtains counter frequency variation of the high-frequency power reflection coefficient based on the high-frequency power and the detected reflection amount thereof, and outputs the detected result to a display monitor 23. The counter frequency variation of the high-frequency power reflection coefficient is displayed on a screen of the display monitor 23 as a graph. That is, in the power reflection coefficient frequency characteristic obtaining section 22, expression [detected reflection amount of high-frequency power/total output amount of high-frequency power (constant amount in this embodiment)] is calculated, and the high-frequency reflection coefficient is obtained, and the obtained reflection coefficient is plotted in correspondence with frequency which is varied from moment to moment, so that the counter frequency variation of the high-frequency power reflection coefficient is obtained.

When the reflection coefficient is largely reduced, this point is the absorption peak where strong high-frequency power absorption is caused due to the plasma density, and this absorption peak is plasma absorption frequency. Since there is a constant correlation between the plasma absorption frequency and the plasma density, effective plasma density information can be obtained. When the plasma absorption frequency is surface wave resonance frequency, the plasma density information can be obtained by simply calculating electron density $n_e$ in plasma which is substantially equivalent to the plasma density.

Subsequently, a concrete plasma density information measuring example by a plasma density information measuring apparatus of the present embodiment will be explained.

Atmosphere of the space S in the chamber 1 was adjusted to be argon 10 mTorr. Then, high-frequency power of 13.56 MHz was applied to the ignition electrode from the high-frequency electric source 8 at the output amount of 1.2 kW, thereby generating reactive plasma PM in the space S.

The tube 14 of the measuring probe 12 is a Pyrex glass tube having outer diameter of 6 mm and dielectric constant of 4. The coaxial cable 16 is a semi-rigid cable of 50Ω, and the conductor piece 17 is made of aluminum foil.

First, as shown in FIG. 2, the measuring probe 12 was set such that the length L between the base end of the loop antenna 15 and the tip end of the tube 14 became 3.5 mm. Then, high-frequency power of 10 mW from 100 kHz to 3 GHz was output from the high-frequency oscillator 18 while conducting swept-frequency. The reflection amount of the high-frequency power at that time was detected by the directional coupler 19, and the counter frequency variation of a reflection coefficient of high-frequency power was measured and displayed on the display monitor 23 as shown with the uppermost curved line Ra in FIG. 6.

Subsequently, as shown in FIG. 5, the set position of the measuring probe 12 was changed such that the length L between the base end of the loop antenna 15 and the tip end of the tube 14 became 5.5 mm, 7.5 mm, 9.5 mm, 11.5 mm and 13.5 mm. At each of the positions, the counter frequency variation of a reflection coefficient of high-frequency power was measured and displayed as the above case. The results are as shown with curved lines Rb to Rf in FIG. 6.

Figure 7:
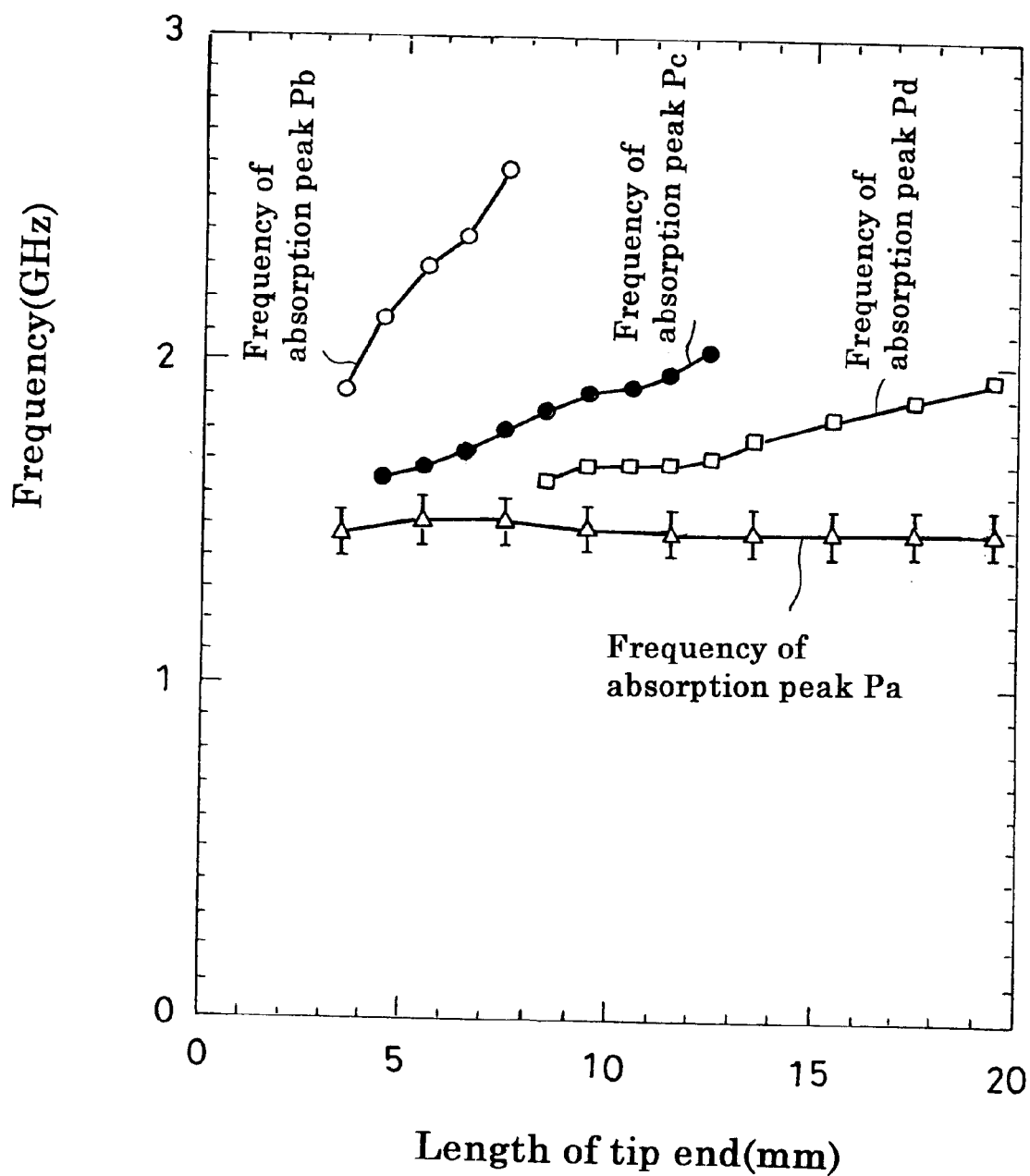
FIG. 7 is a graph showing the relationship between plasma absorption frequency and length of tip end of a tube of the measuring probe.

The curved lines Ra to Rf show some absorption peaks Pa to Pd indicative of strong absorption of the high-frequency plasma density information at the plasma load side. The frequency in the absorption peaks Pa to Pd is plasma absorption frequency. It is possible to grasp the characteristics of the generated plasma PM from the plasma absorption frequency. However, only the absorption peak Pa of the lowest frequency appears in a position of substantially constant frequency (1.5 GHz) even if the tip end length L is varied as shown in FIG. 7, and the same plasma absorption frequency is measured always. Namely, the plasma absorption frequency which does not depend on the tip end length L is plasma surface wave resonance frequency $f(=\omega/2\pi)$. Even an absorption peak which appears at the lowest frequency side, if its frequency is varied when the tip end length L is varied, such an absorption peak is not the plasma surface wave resonance frequency. That is, in the present embodiment, the tip end length L is varied so as to check whether the absorption peak which appears at the lowest frequency side is plasma surface wave resonance frequency.

If the plasma surface wave resonance frequency f is obtained, electron plasma. angle frequency $\omega_p$ is obtained based on the above-mentioned expression as follows:

$$\omega_p = \omega \times \sqrt{(1+\epsilon)} = 2\pi \times 1.5 \times 10^9 \times \sqrt{(1+4)} = 3.35 \times 10^9$$

Further, electron density $n_e$ of plasma PM is obtained as follows:

$$n_e = e_o \cdot m_e \cdot \omega_p/e = 1.4 \times 10^{11}/cm^3$$

Since the electron density $n_e$ of the plasma PM is substantially equivalent to the plasma density, it is easy to grasp (monitor) the characteristics of the generated plasma PM.

In the case of the present embodiment, since the tube is interposed between the plasma PM and the loop antenna 15 as well as the coaxial cable 16, a foreign object should not enter the plasma PM from the loop antenna 15 and the coaxial cable 16, and the clean state of the plasma can be secured. Further, because the tube 14 is interposed, the loop antenna 15 and the coaxial cable 16 are prevented from being damaged by the plasma PM. Furthermore, during the measurement, even if stains comprising insulative films are thinly adhered on the surface of the tube 14, since the insulative film is dielectric, the measuring system is not changed substantially, and variation is not caused in the measured result due to the stains of insulative film. Therefore, it is possible to measure the plasma density information over the long term.

Further, this method is carried out only by supplying the high-frequency power from the loop antenna 15 through the tube 14 to grasp the absorption phenomenon of the resonance high-frequency power which is easily measured. Therefore, plasma density information can be measured extremely easily. Furthermore, hot filament is not used, there is no need to be worried about atmosphere contamination by evaporated tungsten, and it is unnecessary to exchange the hot filament.

When it is necessary to measure plasma density information at another position in plasma PM, the insertion length (shown with M in FIG. 1) of the measuring probe 12 into the chamber 1 may be changed to the other position, and the measurement may be carried out in the same manner as that described above. By measuring the plasma densities at a plurality of positions, it is possible to grasp the distribution of plasma density.

The present invention should not be limited to the above-described embodiment, and can be modified and carried out as follows:

(1) Although the coaxial cable 16 provided at its tip end with the loop antenna 15 is covered with the dielectric tube 14 to form the measuring probe 12 in the above embodiment, the measuring probe 12 is not necessarily covered with the tube 14. That is, it is possible that a coaxial cable is formed at its tip end with the antenna such that the loop antenna 15 or the core wire 16a projects like a needle, and the coaxial cable is directly inserted to plasma to measure the plasma density. In this case, an insulative file may be adhered to the antenna exposed to plasma. However, in the present invention, high-frequency power (electromagnetic wave) is radiated from the antenna, there is little possibility that the measurement is influenced by the insulative film adhered to the antenna.

(2) In the above embodiment, the tube 14 of the measuring probe 12 is detachably mounted to the wall of the chamber 1. However, this structure may be modified such that the tube 14 of the measuring probe 12 is previously fixed to the wall of the chamber 1, and whenever the measurement is carried out, the loop antenna 15, the cable 16 and the conductor piece 17 are inserted into the tube 14 to measure.

Figure 6:
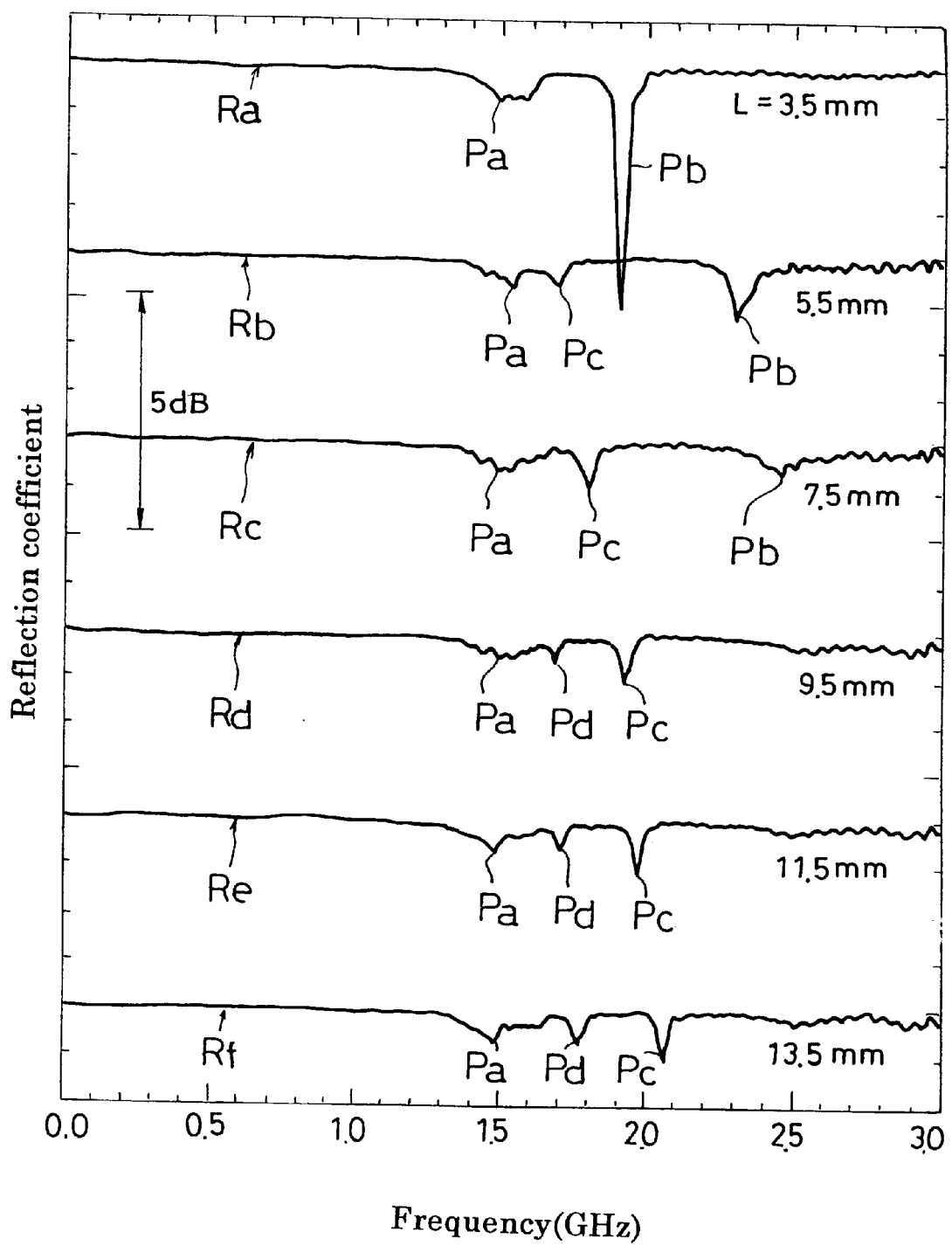
FIG. 6 is a graph showing reflection coefficient frequency characteristics of high-frequency power for measuring the plasma density information.

(3) According to the measuring method of the present invention, as shown in FIG. 6, some plasma absorption frequencies (absorption peaks Pb, Pc, Pd) are observed, other than the plasma surface wave resonance frequency f corresponding to the absorption peak Pa. It is considered that these other plasma absorption frequencies correspond to so-called Tonks-Dattner. As described above, the resonance frequency is related to the electron plasma angle frequency $\omega_p$, if the plasma density is changed, the Tonks-Dattner resonance frequency is also changed. Therefore, plasma density information can be obtained from the Tonks-Dattner resonance frequency. However, since the plasma surface wave resonance frequency f is directly related to the electron density in plasma which is substantially equivalent to the plasma density, the plasma surface wave resonance frequency f is especially useful plasma density information.

(4) In the case of the above embodiment, the physical amount indicative of absorption state of the frequency power by the plasma load was the reflection coefficient of the high-frequency power. In the present invention, impedance value of plasma load is also the physical amount indicative of absorption state of the frequency power by the plasma load. In this case, the counter frequency characteristics of the impedance of plasma load are measured using a channel analyzer.

(5) Although the single measuring probe 12 is disposed in the chamber 1 in the case of the above embodiment, this structure can be modified such that a plurality of measuring probes 12 are disposed in the chamber 1.

(6) Although the plasma density information is obtained by inserting the measuring probe 12 into plasma in the case of the above embodiment, it is not always necessary to dispose the measuring probe 12 into plasma. For example, the chamber 1 shown in FIG. 1 may be provided with a dielectric window such as heat-resistant reinforce glass or quartz, and a frequency irradiation antenna may be provided outside the window, and high-frequency power may be irradiated to plasma in the chamber 1 through this window.

(7) The shape and material of the measuring probe, and kind of the antenna of the invention should not be limited to those of the above embodiment. The plasma of interest of the present invention is not only plasma for processing, and includes plasma used for a particle beam source or an analyzing apparatus.

Figure 8:
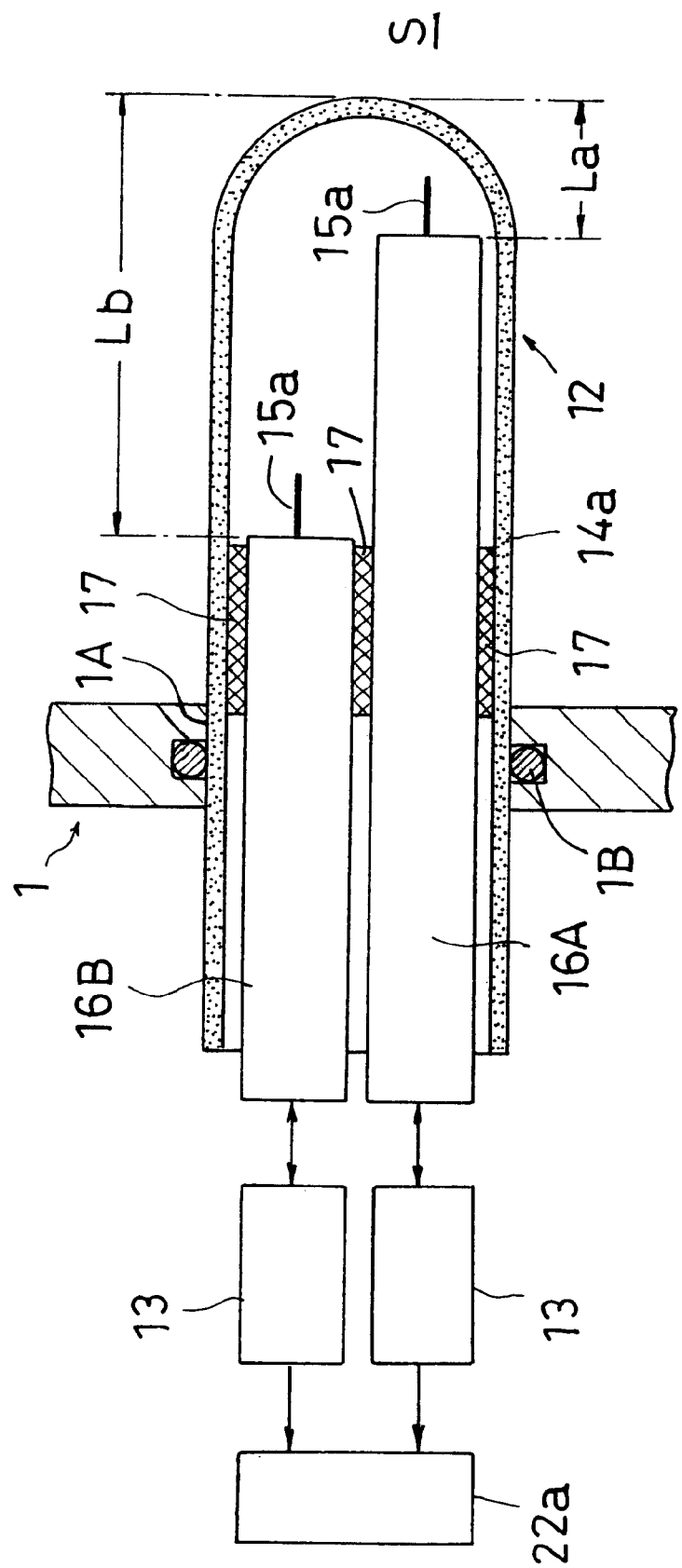
FIG. 8 is a vertical sectional view showing a modification of the measuring probe.

(8) In the above embodiment, the length L between the base end of the loop antenna 15 and the tip end of the tube 14 in the measuring probe 12 is varied, and plasma absorption frequencies of the same level are obtained at the various lengths as the plasma surface wave resonance frequency f. This structure can be modified as follows. As shown in FIG. 8, a plurality of wire-like antennas 15a and 15a as well as coaxial cables 16A and 16B are accommodated in the dielectric tube 14a such that lengths La and Lb between the antenna base end and the tip end of the tube 14 are different. Then, the plasma absorption frequency is obtained for each of the antennas by the power reflection coefficient frequency characteristic obtaining section 22 of the probe control section 13, and the plasma absorption frequency of the resonance frequency is obtained as the plasma surface wave resonance frequency f by an absorption frequency comparator 22a.

Figure 9:
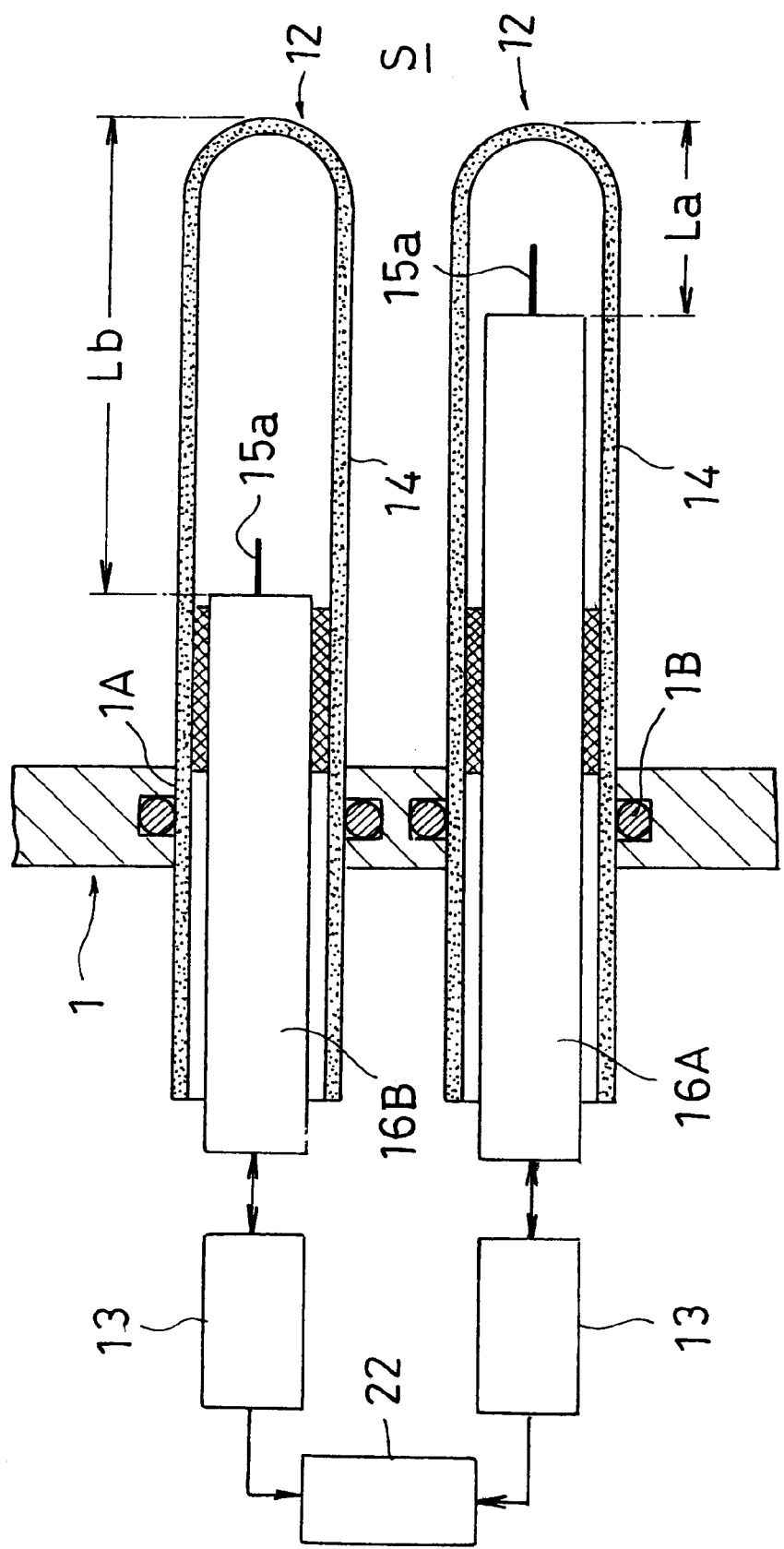
FIG. 9 is a vertical sectional view showing another modification of the measuring probe.

Alternatively, the wire-like antennas 15a, 15a and the coaxial cables 16A, 16B may not be accommodated in a single dielectric tube, and may be separately accommodated in different dielectric tubes 14, as shown in FIG. 9.

With these modifications, the plasma surface wave resonance frequency f can be easily obtained even if the tip end length of the tube 14 is not varied.

(9) In the case of the above embodiment, the reflection amount of the high-frequency power for measuring the plasma density information is taken out by the directional coupler 19. This structure can be modified such that the reflection amount of the high-frequency power is measured by measuring the amount of electric current of high-frequency amplifier for supplying high-frequency power for measuring the plasma density information. The amount of electric current of the high-frequency amplifier has extremely excellent correlation with the reflection amount of the high-frequency power, and it is easy to measure the amount of electric current.

Figure 10:
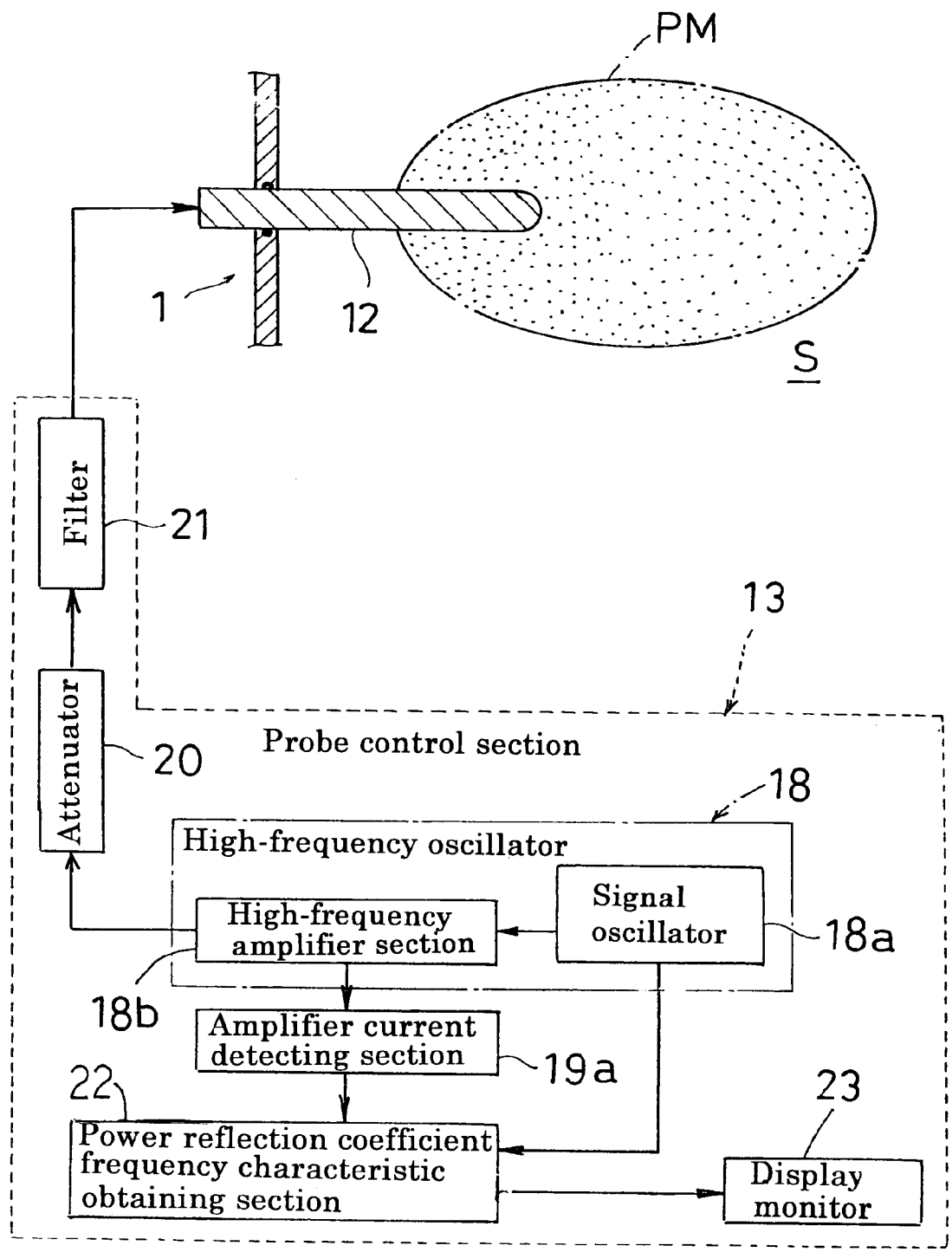
FIG. 10 is a block diagram showing a modification of a probe control section.

More specifically, as shown in FIG. 10, the amount of electric current of a high-frequency amplifier section 18b provided next to a signal oscillator 18a of the high-frequency oscillator 18 is taken out by an amplifier current detecting section 19a, and sent to the power reflection coefficient frequency characteristic obtaining section 22. An example of the amplifier current detecting section 19a is a circuit structure for detecting electric current value of a driving power source of the high-frequency amplifier section 18b.

Figure 11:
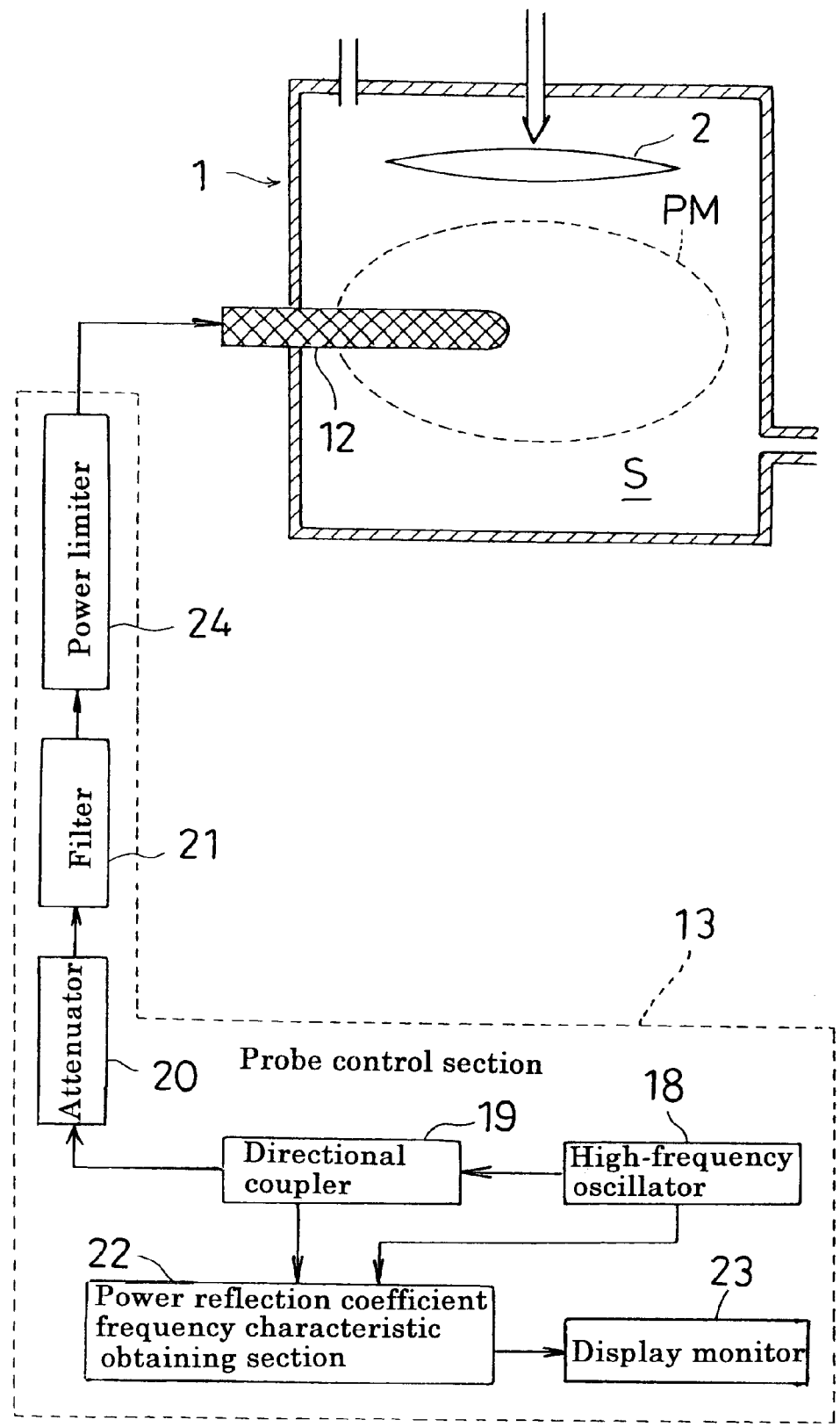
FIG. 11 is a block diagram showing another modification of the probe control section.

(10) As shown in FIG. 11, the above embodiment may be modified such that a power limiter 24 for stopping the high-frequency power which generates excessive plasma entering to the antenna 15 in the probe is provided behind the plasma density information measuring probe 12. Especially when the plasma PM disappears unexpectedly, there is an adverse possibility that the high-frequency power for generating the plasma is directly placed on the antenna 15, and the probe control section 13 is destroyed. In this modification, the power limit 24 prevents the excessive mixed high-frequency power from flowing into the probe control section, thereby preventing the probe control section 13 from being destroyed.

A switch (not shown) such as a relay type coaxial switch and a semiconductor type electronic switch may be used instead of the power limiter 24. The switch may carry out the on-off operation manually. However, in order to prevent the probe control section 13 from being destroyed, it is effective that the switch can detect that the reversely flowing high-frequency exceeds a constant level (e.g., 1.2 times of supplied high-frequency power), and the switch is automatically turned on or off, or plasma light is monitored by an optical sensor, and when the optical sensor detects that the plasma light disappear, the switch is automatically turned on or off.

(11) The above embodiment may be modified such that the measuring probe 12 is inserted for forward and backward movement into the chamber in which the plasma PM is generated, and there is provided prove moving means for moving the measuring probe 12 such that the tip end of the measuring probe 12 is pulled backward from the measuring position in the chamber 1 to a position close to the wall surface of the camber 1 when the measuring is not carried out. With this modification, even plasma generates stains thickly on the surface of the measuring probe 12, the amount of stains is reduced, and the lifetime of the measuring probe 12 is elongated.

Figure 12:
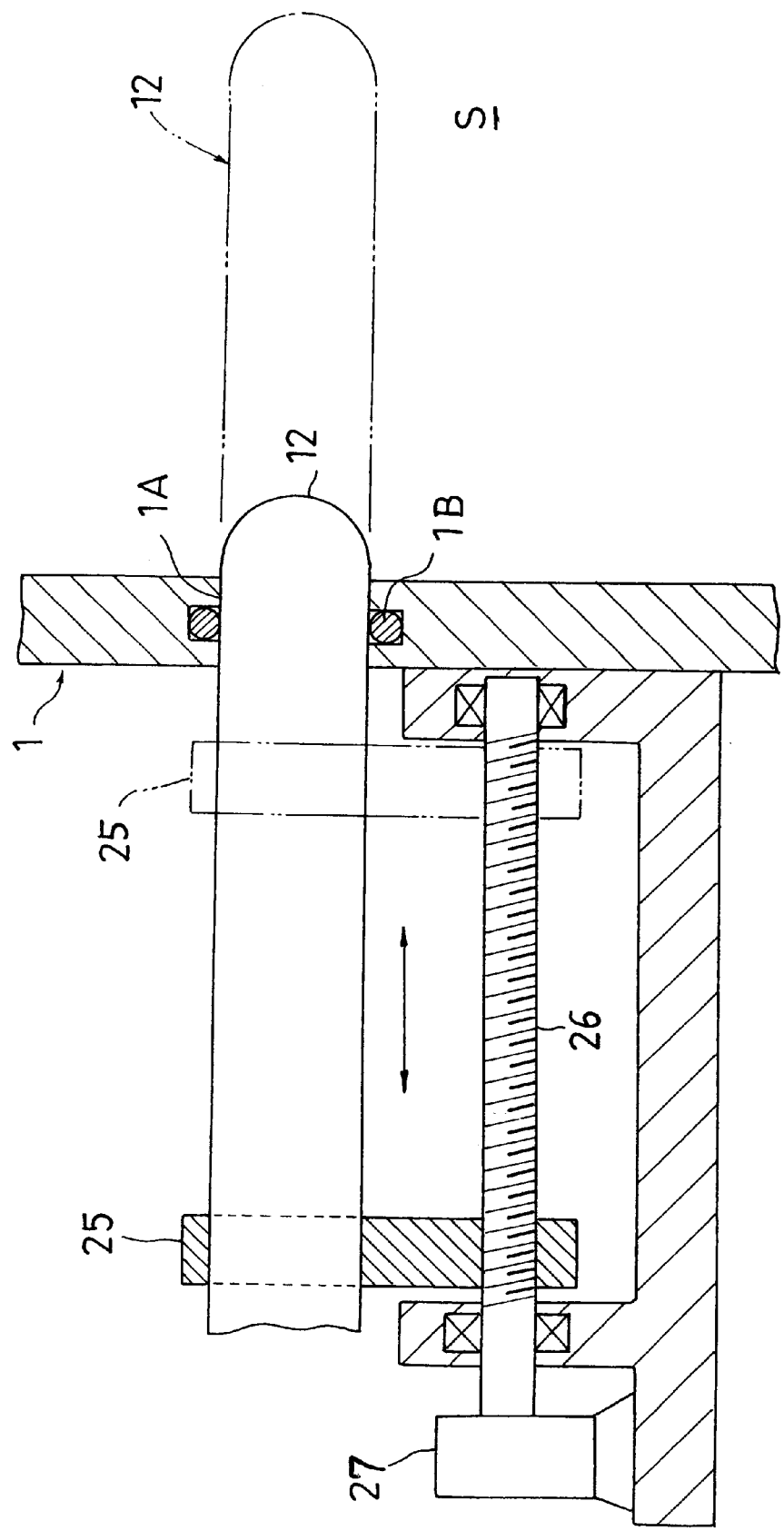
FIG. 12 is a partial sectional view showing the measuring probe and probe moving means.

More specifically, as shown in FIG. 12, the measuring probe 12 is integrally provided with a movable piece 25, the movable piece 25 is threadedly engaged to a sending screw bar 26, and as a motor 27 rotates and the sending screw bar 26 is rotated, the movable piece 25 is reciprocally moved in the longitudinal direction of the measuring probe 12. When measuring is not carried out, the tip end of the measuring probe 12 is pulled backward to a retreat position in the vicinity of the wall surface of the chamber 1 as shown with a solid line in FIG. 12, and when the measuring is carried out, the motor 27 is controlled such that the tip end of the measuring probe 12 is advanced to a measuring position in the chamber 1 as shown with a dotted line in FIG. 12.

Figure 13:
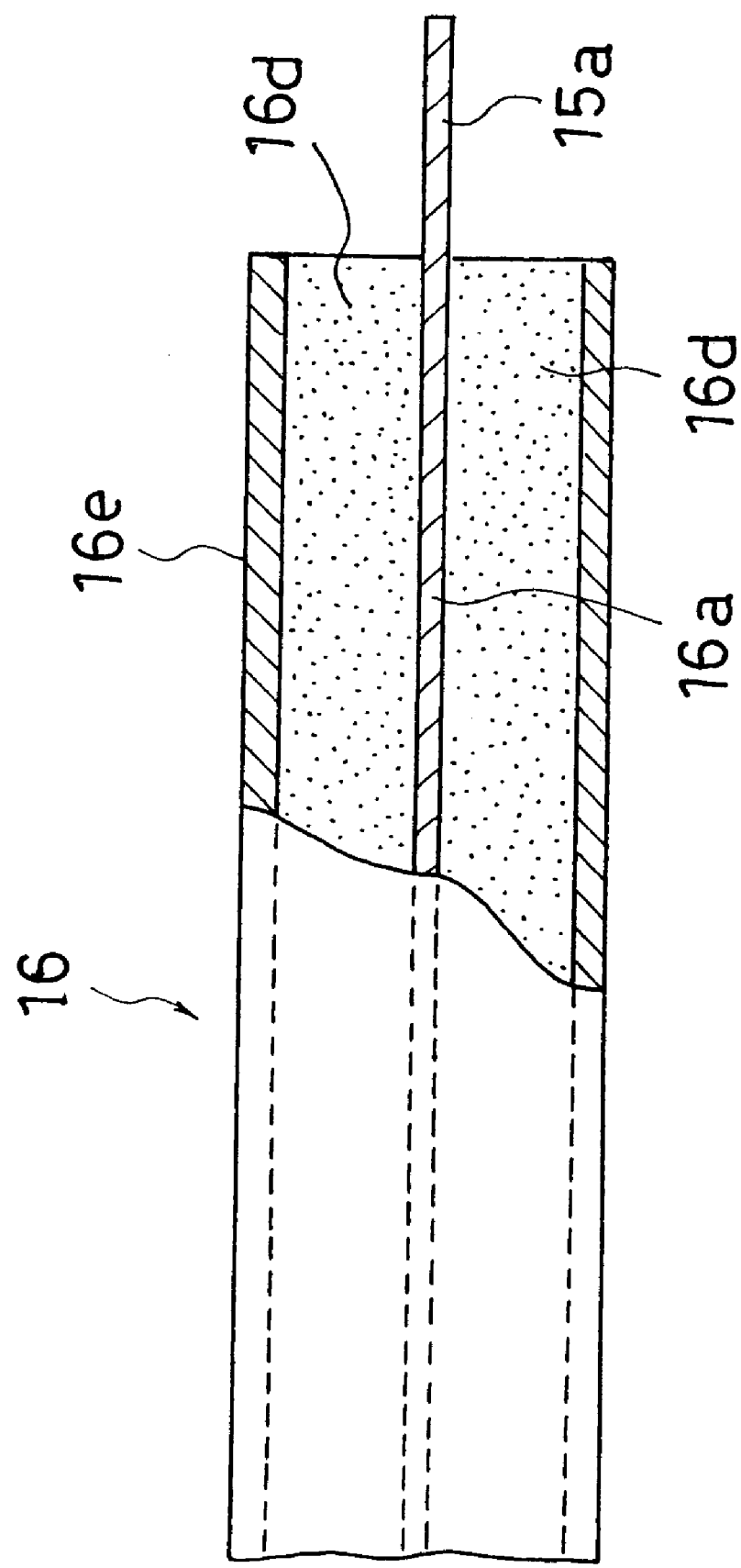
FIG. 13 is a partial vertical sectional view showing a modification of a coaxial cable.

(12) The insulative material 16c between the core wire 16a and the shield wire 16b of the coaxial cable 16 is fluorocarbon resin in the above embodiment. FIG. 13 shows a modification in which an insulative material 16d filling a gap between the core wire 16a and a conductor tube 16e for shield is heat-resistant (insulative) ceramics. In this case, the heat-resistance of the coaxial cable 16 is enhanced.

Figure 14:
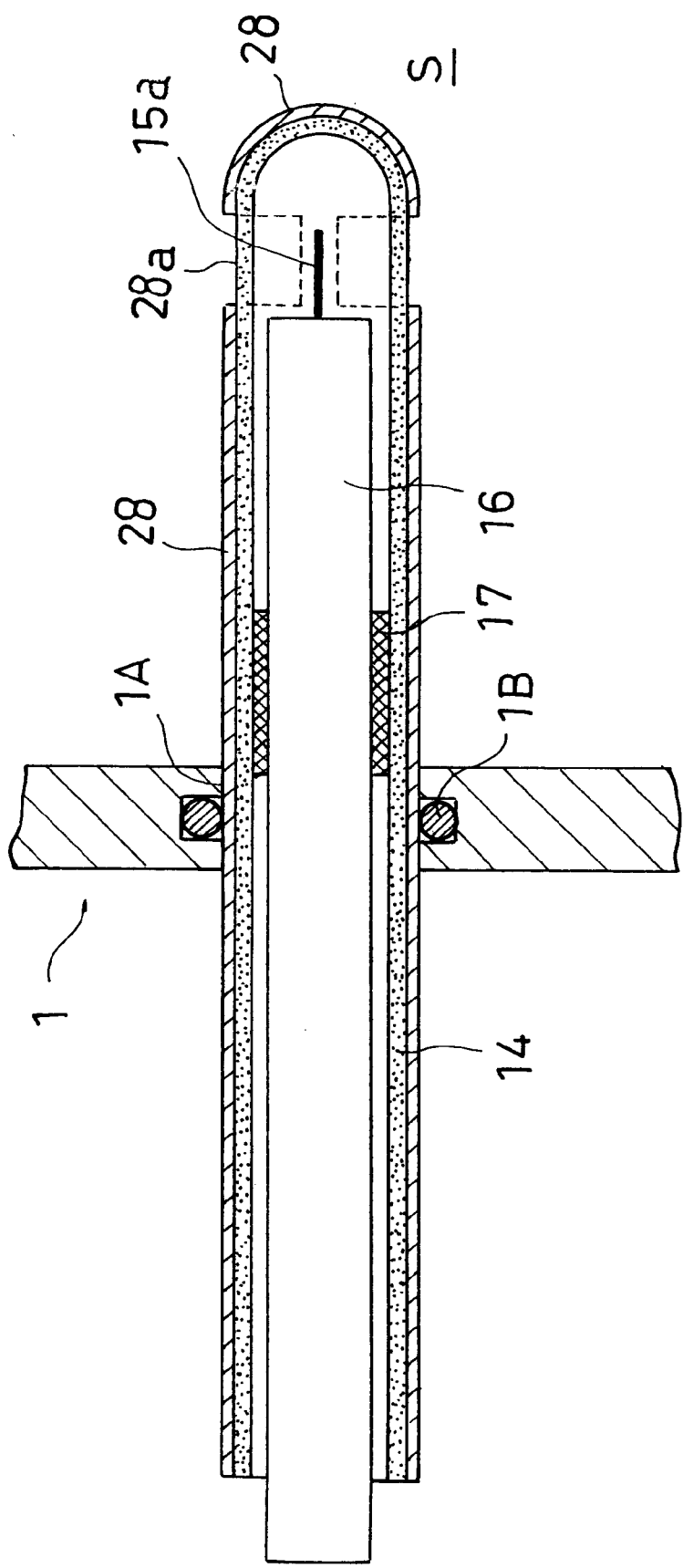
FIG. 14 is a vertical sectional view showing another modification of the measuring probe.

(13) In a measuring probe 12 of another embodiment shown in FIG. 14, a dielectric tube 14 is covered with a metal film 28 such that only a measuring region is not covered with the metal film 28. That is, a portion of the metal film 28 corresponding to the measuring region is cut out to form a window 28a. The high-frequency power does not enter the metal film 28 and can only enter the window 28a. Therefore, a local state of the measuring area that is not coated with the metal film 28 is strongly reflected to the measuring result and as a result, the spatial resolution can be enhanced.

Figure 15:
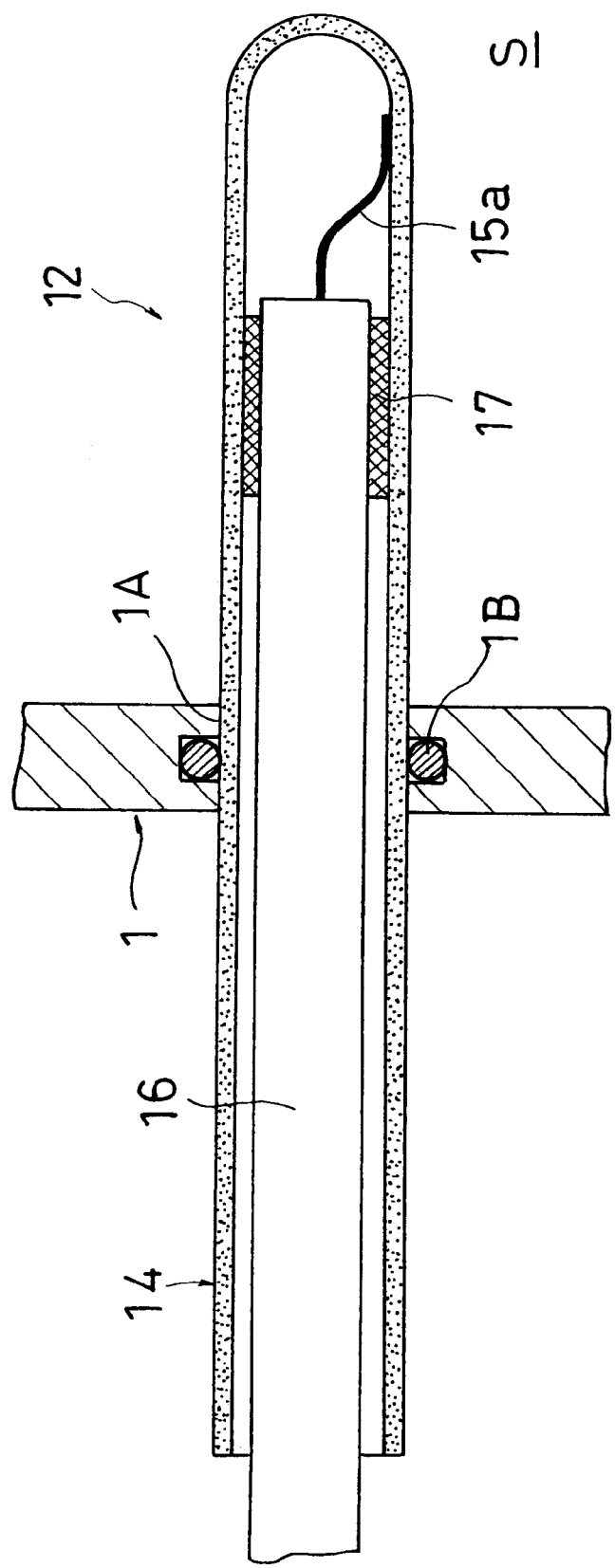
FIG. 15 is a vertical sectional view showing another modification of the measuring probe.

(14) In a measuring probe 12 of another embodiment shown in FIG. 15, the loop antenna 15 is replaced by a wire antenna 15a, and the wire antenna 15a is extended closely along the inner surface of the dielectric tube 14. With this structure, there are merits that the high-frequency power is efficiently supplied, and the required high-frequency power can be reduced, and the measuring precision is enhanced. Even with the loop antenna 15, if it is extended closely along the inner surface of the dielectric tube 14, the high-frequency power is likewise supplied efficiently.

The present invention may be embodied in other specific forms without departing from the spirit or essential attributes thereof and, accordingly, reference should be made to the appended claims, rather than to the foregoing specification, as indicating the scope of the invention.

What is claimed is:

1. A plasma density information measuring method, comprising the steps of:
   supplying high-frequency power to plasma;
   measuring a physical amount indicative of reflection or absorption state of said high-frequency power by plasma load; and
   obtaining a plasma absorption frequency which is a frequency in which strong absorption of high frequency power occurs attributed to the plasma density based on the result of measurement of the physical amount as above.

2. A plasma density information measuring method according to claim 1, wherein said high-frequency power is supplied to plasma through a division wall.

3. A plasma density information measuring method according to claim 1, wherein said physical amount indicative of reflection or absorption state of said high-frequency power by plasma load is measured by measuring an electric current amount of a high-frequency amplifier for supplying high-frequency power.

4. A plasma density information measuring method according to claim 1, wherein said reflection amount of high-frequency power is detected while sweeping high-frequency power frequency, and said plasma absorption frequency is obtained based on relationship between sweep-frequency and a detected result of said reflection amount of high-frequency power.

5. A plasma density information measuring method according to claim 1, wherein a plasma surface wave resonance frequency is obtained as said plasma absorption frequency.

6. A plasma density information measuring method according to claim 5, wherein electron density in plasma to be measured is calculated in accordance with said obtained plasma surface wave resonance frequency.

7. A plasma density information measuring method according to claim 1, wherein Tonks-Dattner resonance frequency is obtained as said plasma absorption frequency.

* * * * *